United States Patent
Rao et al.

(10) Patent No.: US 7,489,191 B2
(45) Date of Patent: Feb. 10, 2009

(54) CIRCUIT AND METHOD FOR REDUCING BIAS NOISE IN AMPLIFIER CIRCUITS

(75) Inventors: Naresh Kesavan Rao, Clifton Park, NY (US); Jianjun Guo, Ballston Spa, NY (US)

(73) Assignee: General Electric Company, Niskayuna, NY (US)

( * ) Notice: Subject to any disclaimer, the term of this patent is extended or adjusted under 35 U.S.C. 154(b) by 60 days.

(21) Appl. No.: 11/759,972

(22) Filed: Jun. 8, 2007

(65) Prior Publication Data

US 2008/0303598 A1    Dec. 11, 2008

(51) Int. Cl.
 *H03F 1/14* (2006.01)
(52) U.S. Cl. .......................... 330/51; 330/149; 330/296
(58) Field of Classification Search .................. 330/51, 330/149, 296
See application file for complete search history.

(56) References Cited

U.S. PATENT DOCUMENTS

| | | | |
|---|---|---|---|
| 3,796,966 A * | 3/1974 | Rauhut | 330/149 |
| 5,554,958 A | 9/1996 | Donoghue | |
| 5,625,322 A | 4/1997 | Gourgue et al. | |
| 6,288,596 B1 | 9/2001 | Johansson et al. | |
| 6,429,991 B1 * | 8/2002 | Tucker et al. | 360/66 |
| 6,452,370 B1 | 9/2002 | Frank | |
| 6,788,161 B2 * | 9/2004 | Vilander | 331/185 |
| 6,920,060 B2 * | 7/2005 | Chow et al. | 365/145 |
| 6,946,912 B2 * | 9/2005 | Retelny, Jr. | 330/296 |
| 7,010,282 B2 | 3/2006 | Kazakevich et al. | |
| 7,053,806 B1 | 5/2006 | Rao et al. | |
| 7,098,739 B2 * | 8/2006 | Chow et al. | 330/285 |
| 2006/0139198 A1 | 6/2006 | Rao et al. | |

FOREIGN PATENT DOCUMENTS

EP      0531101 A2    10/1993

* cited by examiner

*Primary Examiner*—Patricia Nguyen
(74) *Attorney, Agent, or Firm*—Jason K. Klindtworth

(57) ABSTRACT

An amplifier circuit and method for reducing bias noise is disclosed. The amplifier circuit includes a passive biasing source for supplying a desired bias signal to the amplifier and an active biasing source for energizing the passive biasing source to supply the desired bias signal. The amplifier circuit also includes a decoupler for selectively decoupling the active biasing source from the passive biasing source when the amplifier is configured for amplifying an input signal so that the amplifier remains isolated from electronic noise produced by the active biasing source while still being supplied the desired bias signal by the passive source.

20 Claims, 4 Drawing Sheets

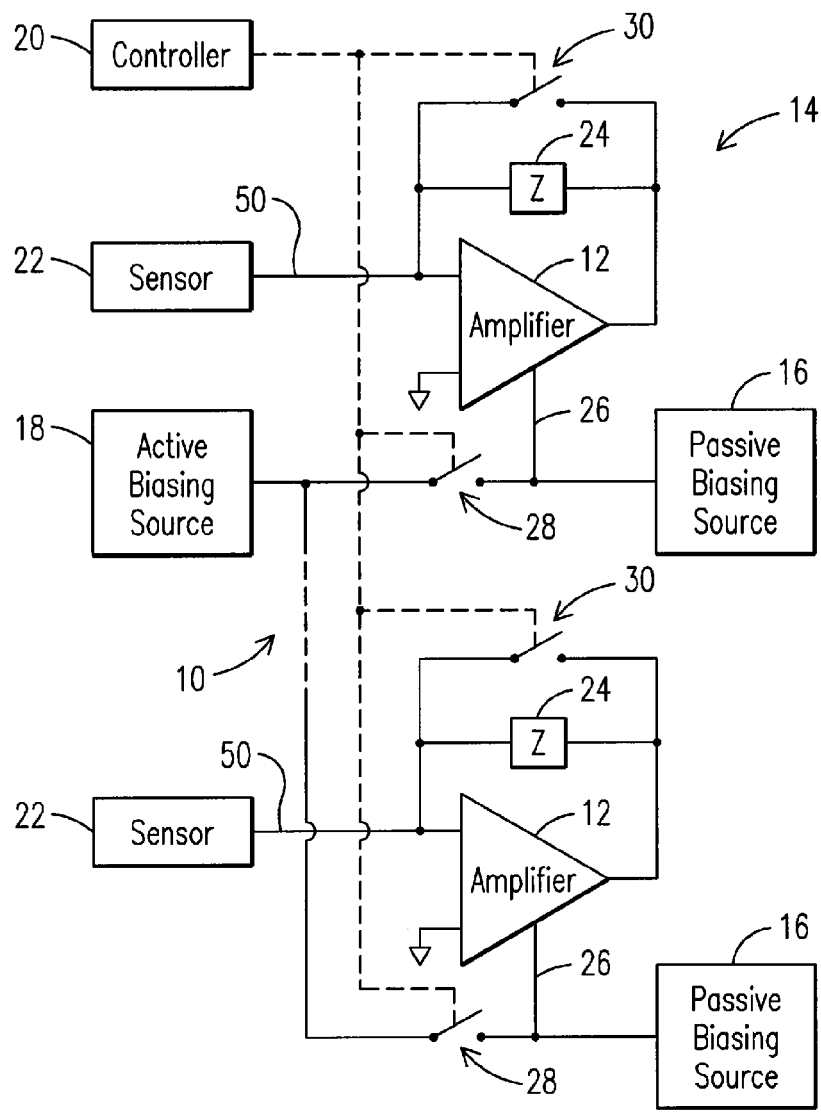
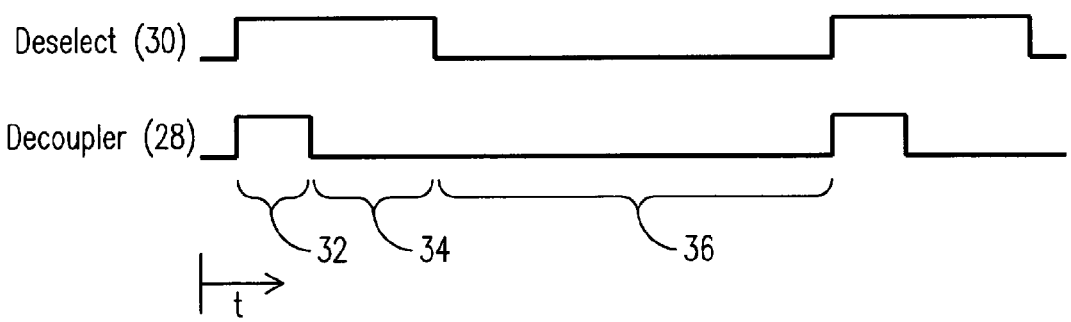
FIG. 2

CIRCUIT AND METHOD FOR REDUCING BIAS NOISE IN AMPLIFIER CIRCUITS

FIELD OF THE INVENTION

The present invention relates to amplifier biasing, and, more particularly, to a circuit and method for reducing bias noise in amplifier circuits.

BACKGROUND OF THE INVENTION

When using low noise amplifiers (LNAs), such as LNAs used in charge to digital conversion systems for x-ray and CT scan equipment, care must be taken to minimize circuit noise. In particular, it is desirable to provide very low noise amplification of sensor signals to minimize a dosage amount needed to perform x-ray and CT scan imaging. As amplitude of an input signal to an amplifier is decreased, an amount of circuit noise that can be tolerated also decreases. Source, biasing, and feedback resistors associated with an LNA each contribute to circuit noise, such as in the form of Johnson noise and/or noise generated by input currents into the amplifier. Typically, noise at the output of the amplifier may is characterized as the root mean square sum of the noise from the sensor, the amplifier, and the biasing circuit.

In the past, low noise biasing of LNAs used in x-ray and CT applications has been achieved using relatively large, high power consuming transistors and/or relatively expensive devices, such as BiCMOS devices. To economize on space and power requirements, an LNA biasing circuit may be shared among multiple channels of an amplification stage to reduce circuit area and power consumption requirements. However, such configurations may lead to crosstalk and correlated noise across the multiple channels. Accordingly, improved low noise biasing of LNAs is desired.

BRIEF SUMMARY OF THE INVENTION

In an example embodiment of the invention, an amplifier circuit for reducing bias noise is provided. The amplifier circuit includes an amplifier, a passive biasing source for supplying a desired bias signal to the amplifier, and an active biasing source for energizing the passive biasing source to supply the desired bias signal. The amplifier circuit also includes a decoupler for selectively decoupling the active biasing source from the passive biasing source when the amplifier is configured for amplifying an input signal so that the amplifier remains isolated from electronic noise produced by the active biasing source while still being supplied the desired bias signal by the passive source.

In another example embodiment, the invention includes an amplifier circuit for reducing bias noise. The amplifier circuit includes a sensor for selectively generating a sensor output and a first amplifier for selectively generating an amplifier output responsive to the sensor output. The first amplifier includes a passive biasing source for supplying a desired bias signal to the first amplifier and an active biasing source for energizing the passive biasing source to supply the desired bias signal. The first amplifier also includes a first decoupler for selectively decoupling the active biasing source from the passive biasing source when the amplifier is configured for amplifying the sensor output so that the amplifier remains isolated from electronic noise produced by the active biasing source while still being supplied the desired bias signal by the passive source. The amplifier circuit also includes a sampling circuit coupled to an output of the first amplifier for selectively sampling the amplifier output of the first amplifier and a controller for controlling a timing of an operation of the sampling circuit relative to an operation of the sensor and an operation of the first amplifier to generate an offset corrected output.

In another example embodiment, the invention includes a method for reducing bias noise in a amplifier circuit. The method includes providing a passive biasing source for supplying a desired bias signal to an amplifier and providing an active biasing source for energizing the passive biasing source to supply the desired bias signal. The method also includes energizing the passive biasing source with the active biasing source and selectively decoupling the active biasing source from the passive biasing source when the amplifier is configured for amplifying a signal so that the amplifier remains isolated from electronic noise produced by the active biasing source while still being supplied the desired bias signal by the passive source.

BRIEF DESCRIPTION OF THE DRAWINGS

FIG. 1 is a schematic diagram of an example low-noise biasing circuit for individual amplifiers of a multi-channel amplifier stage.

FIG. 2 is a timing diagram for an example operation of the low noise biasing circuit of FIG. 1.

DETAILED DESCRIPTION OF THE INVENTION

Figure 3:
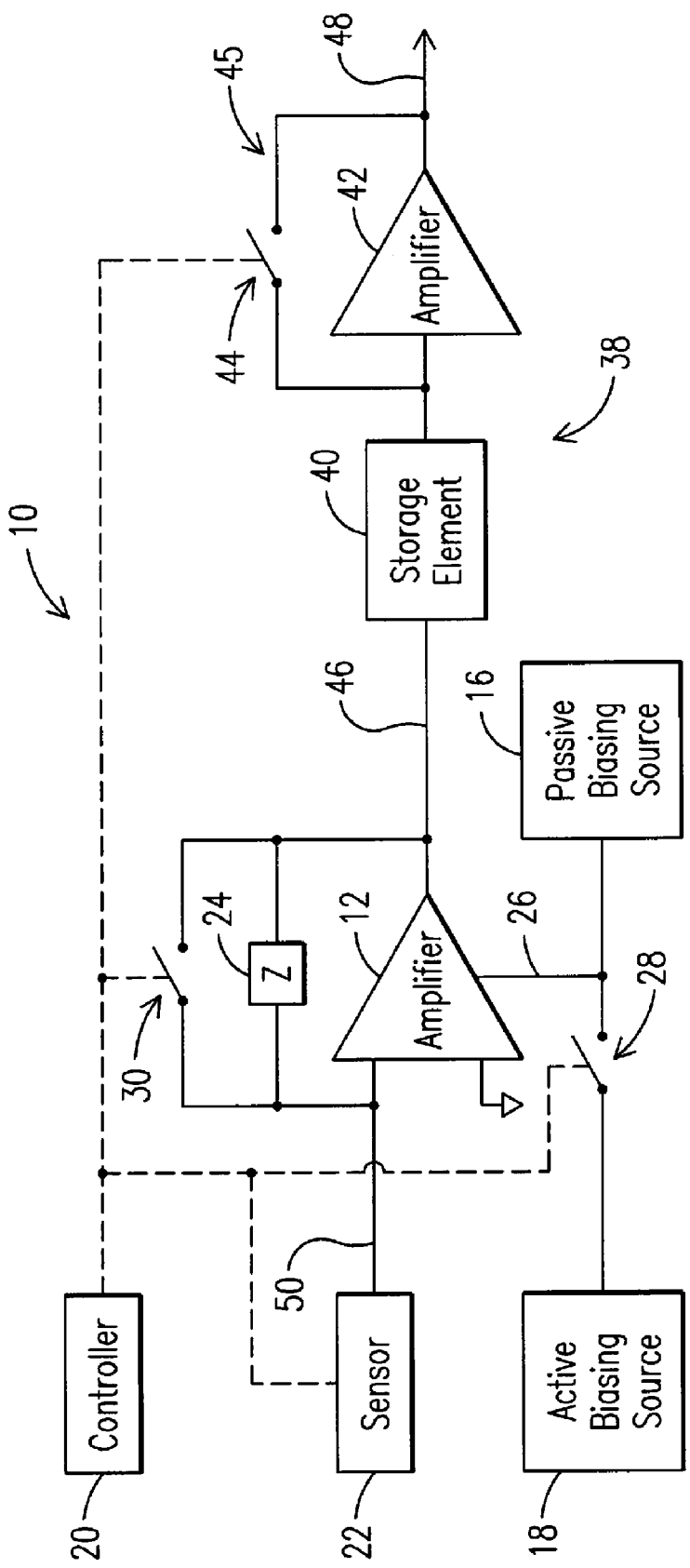
FIG. 3 is a schematic diagram of another example of a low noise biasing circuit for an amplifier stage.

The inventors of the present invention have innovatively realized that by using an active biasing source to energize a passive biasing source for biasing an amplifier, and then selectively decoupling the active biasing source from the passive biasing source when the amplifier is configured for amplifying a signal, electronic noise produced by the active biasing source may be decoupled from a desired bias signal so as to limit an amount of noise coupled to the amplifier.

FIG. 1 is a schematic diagram of an example low noise biasing circuit 10 for one or more amplifiers 12 of a multi-channel amplifier stage 14. While a multi-channel amplifier stage 14 is depicted in FIG. 1, it should be understood that the biasing circuit may be used with a single amplifier 12 that may or may not be a member of an amplifier stage 14. The biasing circuit 10 may include a passive biasing source 16 for applying a desired bias signal 26, such as a desired offset voltage level, to a biasing input of a respective amplifier 12. The biasing circuit 10 may also include an active biasing source 18 for energizing one or more passive biasing sources 16 to supply the desired bias signal 26. In an embodiment, the passive biasing source 16 may include an electrical signal level storage device, such as a capacitive element capable of storing a bias voltage level supplied by the active biasing source 18. In various embodiments, the active biasing source 16 may include a voltage reference, a bandgap reference, a current source, or other types of references for generating the desired bias signal 26.

The biasing circuit 10 may further include a decoupler 28, such as a switch, for selectively decoupling the active biasing source 18 from the passive biasing source 16 when the amplifier 12 is configured for amplifying a signal, such as a sensor signal 50 provided by sensor 22. In an embodiment, the sensor 22 may include an x-ray charge type sensor. By selectively decoupling the active biasing source 18 from the passive biasing source 16, a noise signal produced by the active biasing source 18 may be decoupled from the desired bias signal 26 effective to limit an amount of bias source noise coupled to the amplifier 12. Accordingly, the amplifier 12 may remain isolated from electronic noise produced by the active biasing source 18 while still being supplied the desired bias signal 26 by the passive biasing source 16.

The biasing circuit 10 may also include a deselect 30 for selectively disabling an amplification operation of the amplifier 12. In an embodiment of the invention, the deselect 30 may include a switch connected in parallel with a feedback impedance 24 of the amplifier 12 for selectively shorting the feedback impedance 24 to disable an amplification operation of the amplifier 12 when the switch is closed, and to enable an amplification operation when the switch is open.

The biasing circuit 10 may also include a one or more controller(s) 20 for controlling the decoupler 28 and/or the deselect 30 to accomplishing a desired operation of the biasing circuit 10, for example, as shown in the timing diagram of FIG. 2. During a first time period 32, the controller 20 may be configured for controlling the decoupler 28 to connect the active biasing source 18 to one or more passive biasing source(s) 16 for energizing the passive biasing source(s) 16 to a desired bias level. For example, energizing may include charging a capacitive element of the passive biasing source(s) 16 to the desired bias level. During this time period 32, the controller 20 may also be configured for controlling the deselect 30 to disable an amplification operation of the amplifier 12, such as by shorting the feedback impedance 24 of the amplifier 12. After the first time period 32, the controller 20 may be configured for controlling the decoupler 28 to disconnect the active biasing source 18 from the passive biasing source 16 while disabling the amplification operation of the amplifier 12. In an embodiment, the amplification operation of the amplifier 12 may be disabled for at least a second time period 34 after the active biasing source 18 is decoupled from the passive biasing source 16.

During the second time period 34, the passive biasing source 16 may be configured for maintaining the desired bias level. For example, the passive biasing source may include a capacitive element in the range of about 10 picofarads for maintaining the desired bias level for a second time period 34 of about 10 microseconds. In an aspect of the invention, the second time period 34 may be selected for allowing decoupling, or switching, transient signals generated during decoupling to decay by a desired amount.

At the end of the second time period 34, the controller 20 may be configured for controlling the deselect 30 to enable an amplification operation of the amplifier 12, such as by disconnecting the short across the feedback impedance 24 of the amplifier 12, while leaving the active biasing source 18 disconnected from the passive biasing source 16. Consequently, the active biasing source 18 and any noise component generated by it, and any correlated noise from other sources, may be isolated from the amplifier 12 during an amplification operation, while the passive biasing source 16 provides an appropriate bias level to the amplifier 12. Advantageously, the active biasing source 18 may be turned off during the third time period 36 to reduce power consumption. In an aspect of the invention, the active biasing source 18 may be turned off for about 10 seconds, allowing multiple samples to be acquired during this time period 36 until needing to refresh or recharge the passive biasing source 16 to a desired bias level. Advantageously, the active biasing source 18 does not need to be optimized for low noise as would typically be required because the active biasing source 18 is decoupled from the amplifier 12 when the amplifier 12 is amplifying the sensor signal 50 from the sensor 22.

FIG. 3 is a schematic diagram of another example embodiment of a low noise biasing circuit 10 that employs an amplified signal sampling circuit 38. The biasing circuit 10 may incorporate the circuitry of a single amplifier channel as described previously and depicted in FIG. 1, and may also include a sampling stage 38 connected to an output of the amplifier 12. The sampling circuit 38 may include a storage element 40, such as a low pass filter, and an amplifier 42. The sampling circuit 38 may include a second deselect 44 for selectively disabling an amplification operation of the amplifier 42. In an embodiment of the invention, the second deselect 44 may include a switch for selectively providing an electrical path 45 around the amplifier 42 to disable the amplification operation of the amplifier 42 when the switch is closed, and to enable an amplification operation when the switch is open.

In an aspect of the invention, the sensor 22 may be configured for selectively generating a sensor output 50 and providing the sensor output 50 to a first amplifier 12. The first amplifier 12 may be configured for selectively generating a first amplifier output 46 responsive to the sensor output 50. The biasing circuit 10 may include a passive biasing source 16 for supplying a desired bias signal 26 to the first amplifier 16, and an active biasing source 18 for energizing the passive biasing source 16 to supply the desired bias signal 26. A decoupler 28 may be provided for selectively decoupling the active biasing source 18 from the passive biasing source 16 when the first amplifier 12 is used for amplifying the sensor output 50 so that so that the amplifier 12 remains isolated from electronic noise produced by the active biasing source 18 while still being supplied the desired bias signal 26 by the passive biasing source 16.

Figure 4:
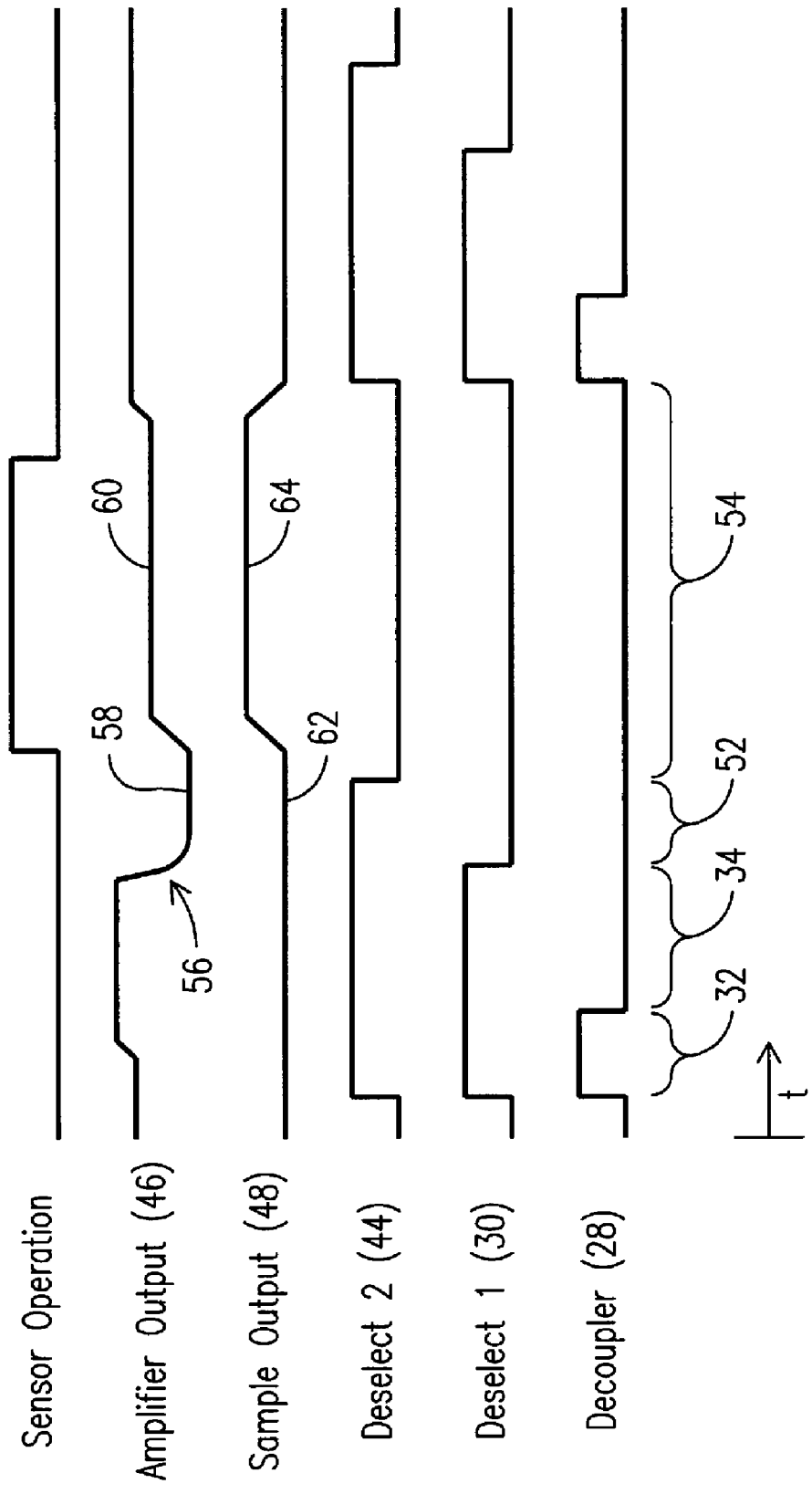
FIG. 4 is a timing diagram for an example operation of the low noise biasing circuit of FIG. 3.

The sampling circuit 38 may coupled the first amplifier 16 for receiving the amplifier output 46 and for selectively sampling amplifier output 46 under different operating conditions of the sensor 22 and the amplifier 12. One or more controller(s) 20 may be provided for controlling a timing of an operation of the sampling circuit 38 relative to an operation of the sensor 22 and an operation of the first amplifier 12 to generate an offset corrected amplifier output. The controller 20 may be configured for controlling the decoupler 28, the deselect 30 and/or the second deselect 44 for accomplishing a desired operation of the biasing circuit 10 as shown in the timing diagram of FIG. 4.

During a first time period 32, the controller 20 may be configured for controlling the decoupler 28 to connect the active biasing source 18 to the passive biasing source 16 for energizing the passive biasing source 16 to a desired bias level. During this time period 32, the controller 20 may also be configured for controlling the deselect 30 to disable the amplification operation of the amplifier 12, such as by shorting the feedback impedance 24 of the amplifier 12. Also during this time period 32, the controller 20 may be configured for controlling the second deselect 44 to disable the amplification operation of the amplifier 42 of the sampling circuit 38, such as by bypassing the amplifier 42.

After the first time period 32, the controller 20 may be configured for controlling the decoupler 28 to disconnect the active biasing source 18 from the passive biasing source 16 while disabling the amplification operation of the amplifier 12. The amplifier 12 may be disabled for at least a second time period 34 after the active biasing source 18 is decoupled from the passive biasing source 16. As shown in the timing diagram of FIG. 4, the amplifier output 46 may become offset by a certain amount after the active biasing source 18 is decoupled from the passive biasing source 16.

At the end of the second time period 34, the controller 20 may be configured for controlling the deselect 30 to enable an amplification operation of the amplifier 12, while leaving the active biasing source 18 disconnected from the passive biasing source 16, thereby limiting noise coupling from the active biasing source 18 to the amplifier 12 during an amplification operation. As depicted in of FIG. 4, the amplifier output 46 may change when the amplification operation of the amplifier 12 is enabled at the beginning of time period 52. For example, the amplifier output 46 may acquire a characteristic know as a pedestal 56 before settling to a relatively constant pedestal level 58. Consequently, the controller 20 may be configured for disabling a sensing operation of the sensor 22 until the amplifier output 46 reaches a relatively constant pedestal level 58 after enabling the amplification operation. During this time period, a first sample output level 62 of the sample output 48 remains the same as the constant pedestal level 58 of the amplifier output 46 and may be treated as a first reference sample output level for later processing to remove an offset in the amplifier output 46.

At the end of the third time period 52, the controller 20 may be configured for controlling the second deselect 44 to enable an amplification operation of the amplifier 42, such as by disconnecting the electrical path 45 around the amplifier 42 during a fourth time period 54. The controller 20 may also be configured for enabling sensor 22 operation during this fourth time period 54. Accordingly, a sensor output 50 may be amplified by amplifier 12 to generate an amplifier output level 60 superimposed on the pedestal level 58. However, the sample output 48 only changes responsive to the constant pedestal level 58 to produce a second sample output level 64 with respect to the first sample output level 62. Therefore, to mitigate the offset of the pedestal level 58, the first sample output level 62 may be subtracted from the second sample output level 64 to provide a more accurate indication of the amplifier output 46, for example, using a correlated double sampling technique.

Figure 5:
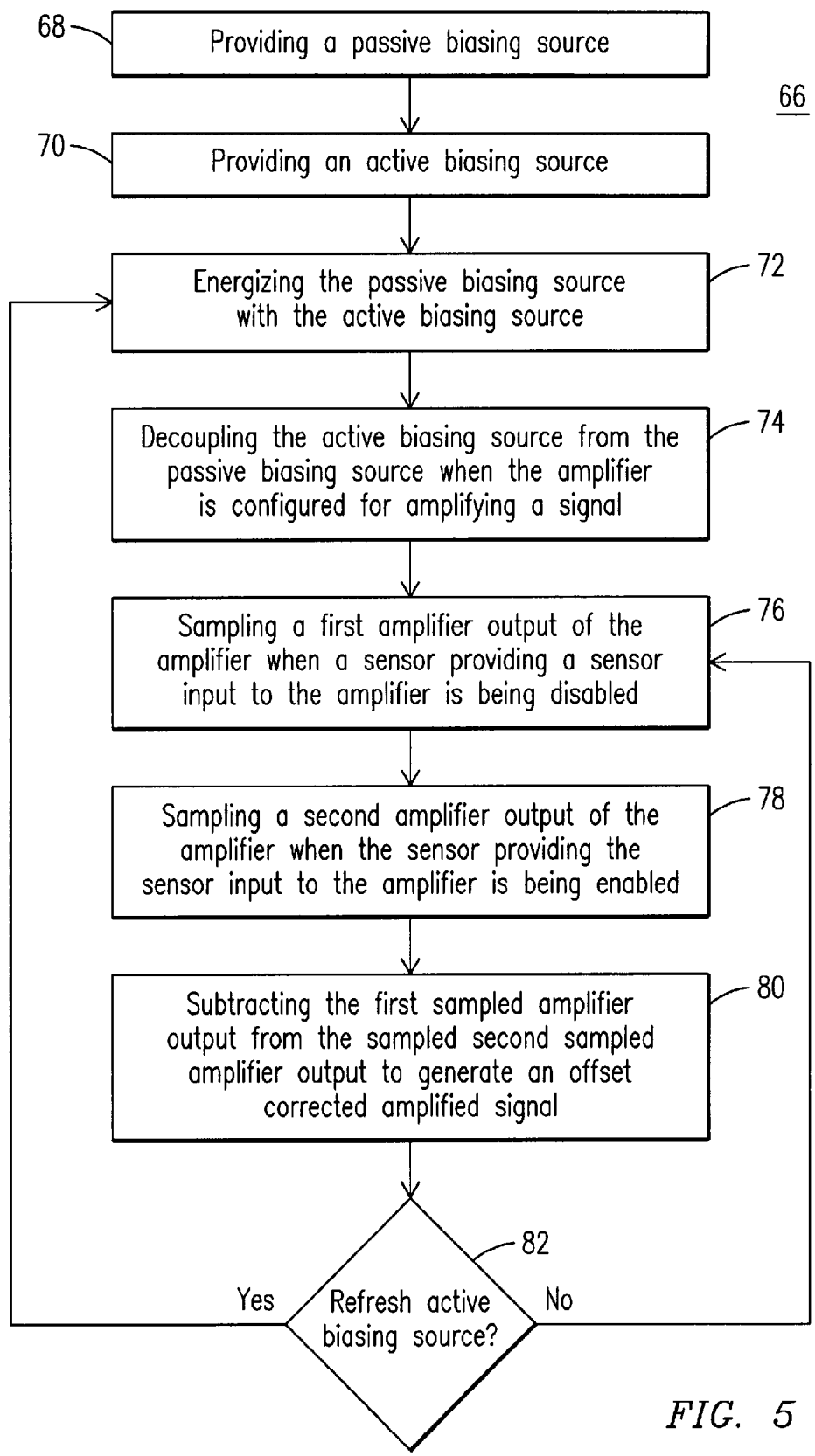
FIG. 5 is a flow diagram of an example method for biasing an amplifier.

FIG. 5 is a flow diagram 66 of an example method for amplifying a signal. The method may include providing a passive biasing source 68, such as the passive biasing source 16 described above and shown in FIG. 2, for applying a desired bias signal to a biasing input of an amplifier 12. The method may also include providing an active biasing source 70, such as the active biasing source 18 described above, for energizing the passive biasing source to generate the desired bias signal. The method may then include energizing the passive biasing source with the active biasing source 72. The method may further include selectively decoupling the active biasing source from the passive biasing source when the amplifier is being used for amplifying a signal 74. The method may further include disabling an amplification operation of amplifier for at least a time period after the active biasing source is decoupled from the passive biasing source. In an embodiment, the time period may be selected for allowing decoupling transient signals generated during decoupling to decay to a desired signal level. According to the method, a noise signal produced by the active biasing source may be decoupled from the desired bias signal so as to limit an amount of noise coupled to the amplifier.

In another embodiment, the method may include sampling a first amplifier output of the amplifier when a sensor providing an sensor input to the amplifier is disabled 76 and then sampling a second amplifier output of the amplifier when a sensor providing an sensor input to the amplifier is enabled 78. The method may further include subtracting the sampled first sampled amplifier output to the second sampled amplifier signal output to generate an offset corrected amplified signal 80, for example, using a correlated double sampling technique.

In yet another embodiment, the method may include determining whether to refresh, or recharge, the passive biasing source 82, or continue to sample an output of the sensor 22. For example, the fourth time period 54 of FIG. 4 may be extended up to about 10 seconds to allow more than one sample to be acquired during that time period 54 before needing to refresh the passive biasing source 16 of FIG. 3. This allows for sensor 22 to be configured in a burst mode for acquiring multiple samples in a relatively short period of time, without having to refresh the passive biasing source 16. An upper limit of a number of samples that can be acquired without refresh may be dictated by how long the passive biasing source 16 is able to maintain a desired bias level.

While various embodiments of the present invention have been shown and described herein, such embodiments are provided by way of example only. Numerous variations, changes and substitutions will occur to those of skill in the art without departing from the invention herein. Accordingly, it is intended that the invention be limited only by the spirit and scope of the appended claims.

We claim as our invention:

1. An amplifier circuit for reducing bias noise comprising:
an amplifier;
a passive biasing source for supplying a desired bias signal to the amplifier;
an active biasing source for energizing the passive biasing source to supply the desired bias signal, and
a decoupler for selectively decoupling the active biasing source from the passive biasing source when the amplifier is configured for amplifying an input signal so that the amplifier remains isolated from electronic noise produced by the active biasing source while still being supplied the desired bias signal by the passive source.

2. The amplifier circuit of claim 1, further comprising an amplifier deselect for selectively disabling the amplifier from amplifying the input signal.

3. The amplifier circuit of claim 2, further comprising a controller for controlling the decoupler and the deselect for disabling the amplifier from amplifying the input signal for at least a time period after the active biasing source is decoupled from the passive biasing source.

4. The amplifier circuit of claim 2, wherein the deselect time period is selected for allowing decoupling transient signals generated during decoupling to decay to a desired level.

5. The amplifier circuit of claim 1, wherein the bias signal comprises a desired offset voltage level.

6. The amplifier circuit of claim 1, wherein the passive biasing source comprises a capacitive element.

7. An amplifier circuit for reducing bias noise comprising:
a sensor for selectively generating a sensor output;
a first amplifier for selectively generating an amplifier output responsive to the sensor output comprising:
a passive biasing source for supplying a desired bias signal to the first amplifier;
an active biasing source for energizing the passive biasing source to supply the desired bias signal;
a first decoupler for selectively decoupling the active biasing source from the passive biasing source when the amplifier is configured for amplifying the sensor output so that the amplifier remains isolated from electronic noise produced by the active biasing source while still being supplied the desired bias signal by the passive source;

a sampling circuit coupled to an output of the first amplifier for selectively sampling the amplifier output of the first amplifier; and a controller for controlling a timing of an operation of the sampling circuit relative to an operation of the sensor and an operation of the first amplifier to generate an offset corrected output.

8. The amplifier circuit of claim 7, further comprising an amplifier deselect for selectively disabling the first amplifier from amplifying the sensor output.

9. The amplifier circuit of claim 8, wherein the controller is further configured for disabling the first amplifier from amplifying the sensor output for at least a time period after the active biasing source is decoupled from the passive biasing source.

10. The amplifier circuit of claim 9, wherein the deselect time period is selected for allowing decoupling transient signals generated during decoupling to decay to a desired level.

11. The amplifier circuit of claim 7, wherein the bias signal comprises a desired voltage level.

12. The amplifier circuit of claim 7, wherein the passive biasing source comprises a capacitive element.

13. A method for reducing bias noise in a amplifier circuit comprising:

providing a passive biasing source for supplying a desired bias signal to an amplifier;

providing an active biasing source for energizing the passive biasing source to supply the desired bias signal;

energizing the passive biasing source with the active biasing source; and selectively decoupling the active biasing source from the passive biasing source when the amplifier is configured for amplifying a signal so that the amplifier remains isolated from electronic noise produced by the active biasing source while still being supplied the desired bias signal by the passive source.

14. The method of claim 13, further comprising disabling an amplification operation of the amplifier for at least a time period after the active biasing source is decoupled from the passive biasing source.

15. The method of claim 14, wherein the time period is selected for allowing a decoupling transient signal generated during decoupling to decay to a desired level.

16. The method of claim 13, wherein the bias signal comprises a desired voltage level.

17. The method of claim 13, wherein the passive biasing source comprises a capacitive element.

18. The method of claim 13, further comprising sampling a first amplifier output of the amplifier when a sensor providing a sensor input to the amplifier is being disabled.

19. The method of claim 18, further comprising sampling a second amplifier output of the amplifier when the sensor providing the sensor input to the amplifier is being enabled.

20. The method of claim 19, further comprising subtracting the first sampled amplifier output from the second sampled amplified output to generate an offset corrected amplified signal.

* * * * *